United States Patent
Chiang

(10) Patent No.: US 7,871,274 B2
(45) Date of Patent: Jan. 18, 2011

(54) IC ADAPTER FOR REMOVABLY MOUNTING INTEGRATED CIRCUIT

(75) Inventor: Cheng-Lien Chiang, Taipei (TW)

(73) Assignee: Nichepac Technology Inc., Taipei County (TW)

( * ) Notice: Subject to any disclaimer, the term of this patent is extended or adjusted under 35 U.S.C. 154(b) by 0 days.

(21) Appl. No.: 12/509,757

(22) Filed: Jul. 27, 2009

(65) Prior Publication Data

US 2010/0035444 A1   Feb. 11, 2010

(30) Foreign Application Priority Data

Aug. 8, 2008   (TW) .............................. 97130408 A

(51) Int. Cl.
*H01R 12/00* (2006.01)
*H05K 1/00* (2006.01)
(52) U.S. Cl. ........................................ 439/66; 439/700
(58) Field of Classification Search .................. 439/66, 439/91, 591, 70, 700
See application file for complete search history.

(56) References Cited

U.S. PATENT DOCUMENTS

| | | | | |
|---|---|---|---|---|
| 5,702,255 A | * | 12/1997 | Murphy et al. | 439/71 |
| 5,877,554 A | * | 3/1999 | Murphy | 257/727 |
| 5,917,703 A | * | 6/1999 | Murphy | 361/704 |
| 7,140,884 B2 | * | 11/2006 | Brodsky et al. | 439/66 |
| 7,220,134 B2 | * | 5/2007 | Goodman et al. | 439/70 |

* cited by examiner

*Primary Examiner*—Hae Moon Hyeon

(57) ABSTRACT

An integrated circuit (IC) adapter is disclosed to be adaptive sandwiched in between a ball grid array (BGA) integrated circuit (IC) and a printed circuit board to electrically couple the ball grid array IC and the printed circuit board. The IC adapter has a plurality of through holes therein, a resilient element in each of the through hole; in combination with a binding element for binding the integrated circuit (IC) onto the IC adapter such that the ball grid array IC can be removed, manually and without using any maintenance tool, from the IC adapter.

17 Claims, 17 Drawing Sheets

IC ADAPTER FOR REMOVABLY MOUNTING INTEGRATED CIRCUIT

RELATED APPLICATIONS

The present application is based on, and claims priority from, Taiwan Application Serial Number 097130408, filed Aug. 8, 2008, the disclosure of which is hereby incorporated by reference herein in its entirety.

FIELD OF THE INVENTION

This invention relates to a ball grid array (BGA) integrated circuit (IC) adapter, especially an IC adapter adaptive to be sandwiched in between a ball grid array IC and a printed circuit board (PCB) such that the ball grid array IC can be mounted/removed manually without using any maintenance tool on/from the PCB.

BACKGROUND

FIG. 1 is a prior art.

A traditional combination system for a ball grid array (BGA) integrated circuit (IC) 500 with ball grid array 501 underside, the ball grid array IC 500 is soldered directly onto a printed circuit board (PCB) 504. Each metal ball of the ball grid array 501 is firmly soldered to a corresponding pad 503 of a printed circuit board (PCB) 504 by solder 502. The ball grid array IC 500 is un-detachable from the PCB 200 manually if without using a heater to melt the solder 502. It is inconvenient for a user to upgrade the ball grid array IC 500 or remove a failure ball grid array IC 500 or mount a new one if without using a maintenance tool including at least a heating tool and a soldering tool. It is desirable if a ball grid array IC can be removed and replaced easily from a printed circuit board manually at any time and without using any maintenance tool from the PCB 504.

DETAILED DESCRIPTION OF EMBODIMENTS

The applicant firstly figured out an IC adapter which is adaptive to be sandwiched in, and electrically coupling, between a ball grid array IC and a printed circuit board. The IC adapter has a plurality of through holes corresponding to each metal ball under the ball grid array IC. A resilient element in configured in each of the through hole. The top of each resilient element is adaptive to electrically contact with each corresponding metal ball of the ball grid array IC, in combination with a binding element for binding the ball grid array IC against the IC adapter such that the ball grid array IC can be easily removed and replaced, manually and without using any maintenance tool, from the IC adapter.

Figure 1:
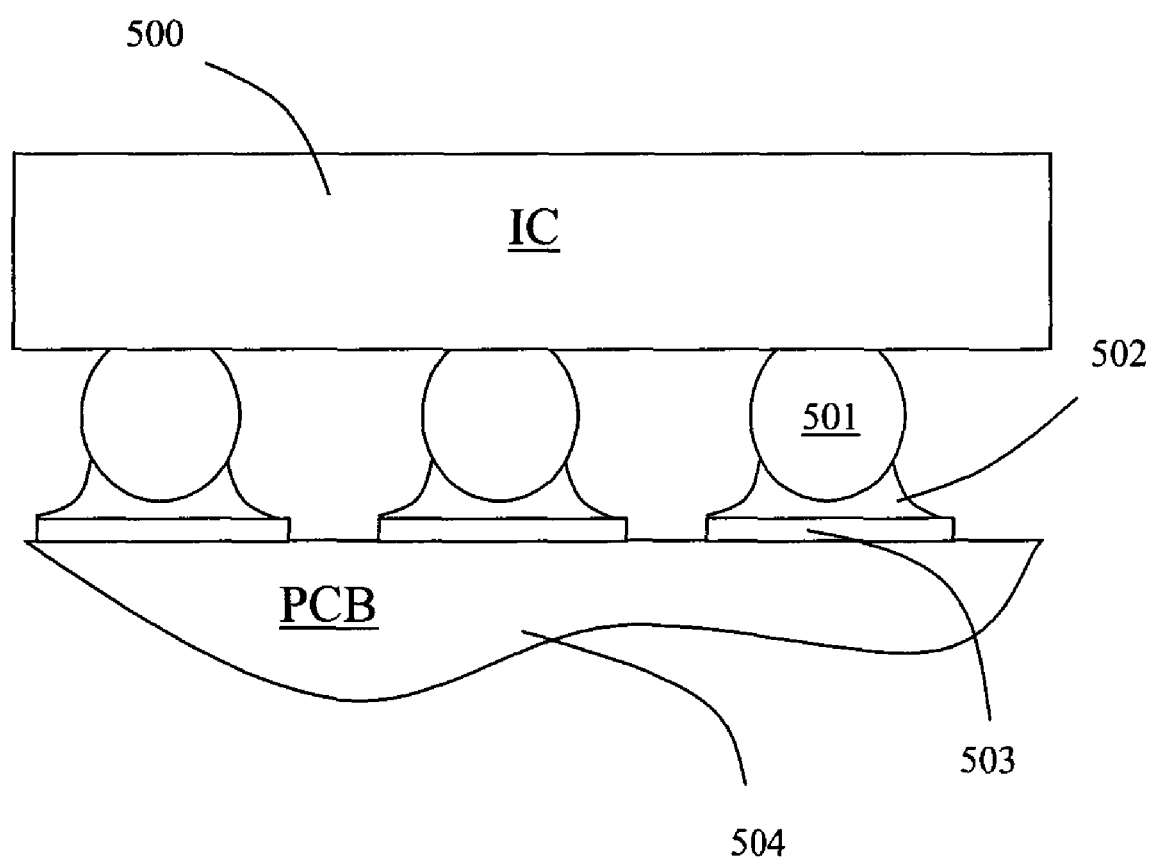
FIG. 1 is a prior art.
Figure 2:
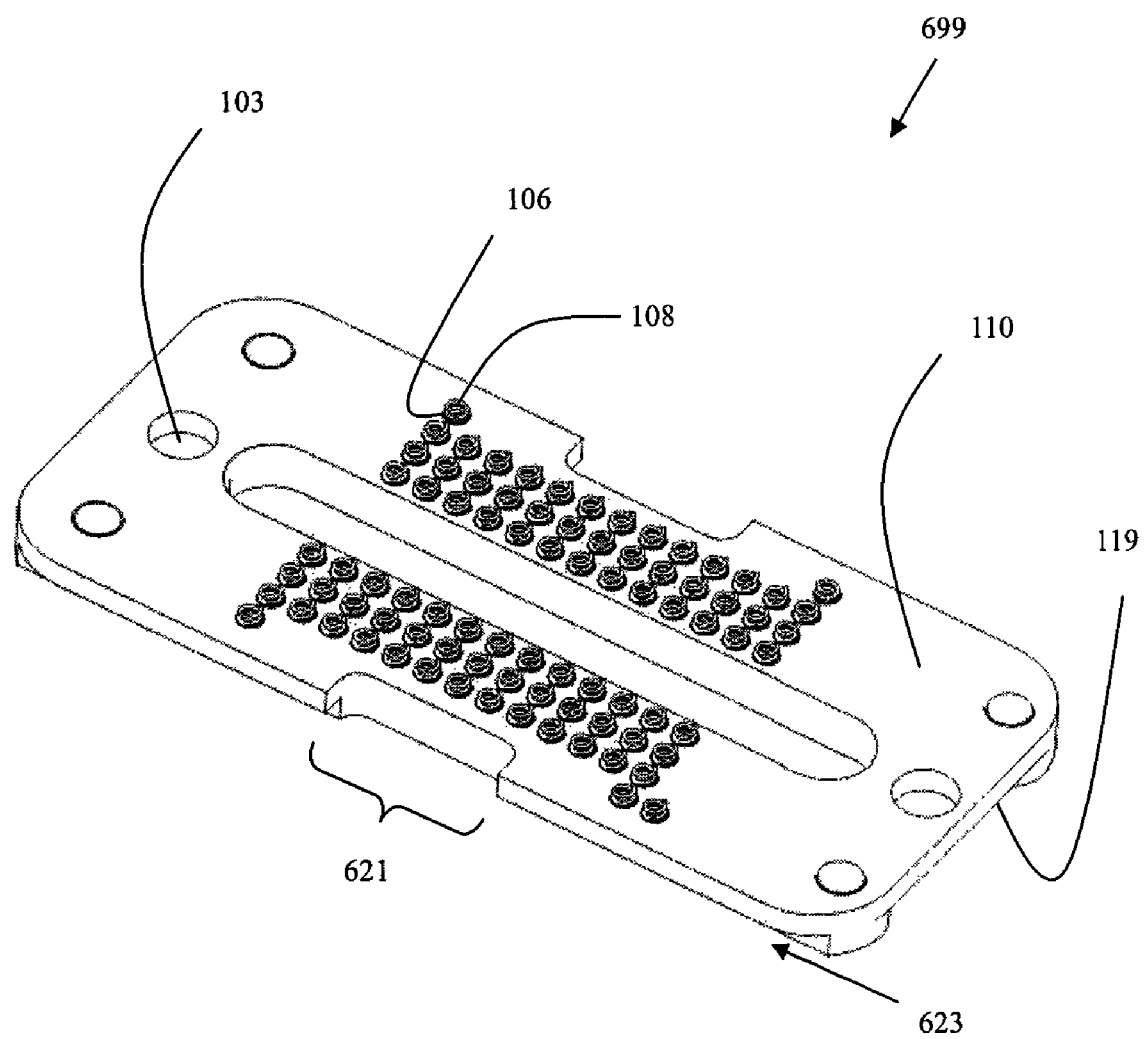
FIG. 2 is a first embodiment of an IC adapter according to the present invention.

FIG. 2 is a first embodiment of an IC adapter according to the present invention.

An IC adapter 699 has a top surface 110, a bottom surface 119, and a plurality of through holes 106. Each of the through holes 106 extends from the top surface 110 to the bottom surface 119 of the IC adapter 699. Several mounting holes 103 are designed for fixing the IC adapter 699 onto a printed circuit board 200 (see FIG. 14). A resilient element such as a spring 108 (as will be described with respect to FIGS. 8-10, 13) or a spring 108B (as will be described with respect to FIGS. 4-5) or an equivalent element is placed in each of the through holes 106. The IC adapter 699 has a pair of position recess 621, one recess is on the left and the other one is on the right. The IC adapter 699 has a pair of sliding recess 623 underside, one is on the left underside communicated with the left position recess 621 and the other one is on the right underside communicated with the right position recess 621.

Figure 3:
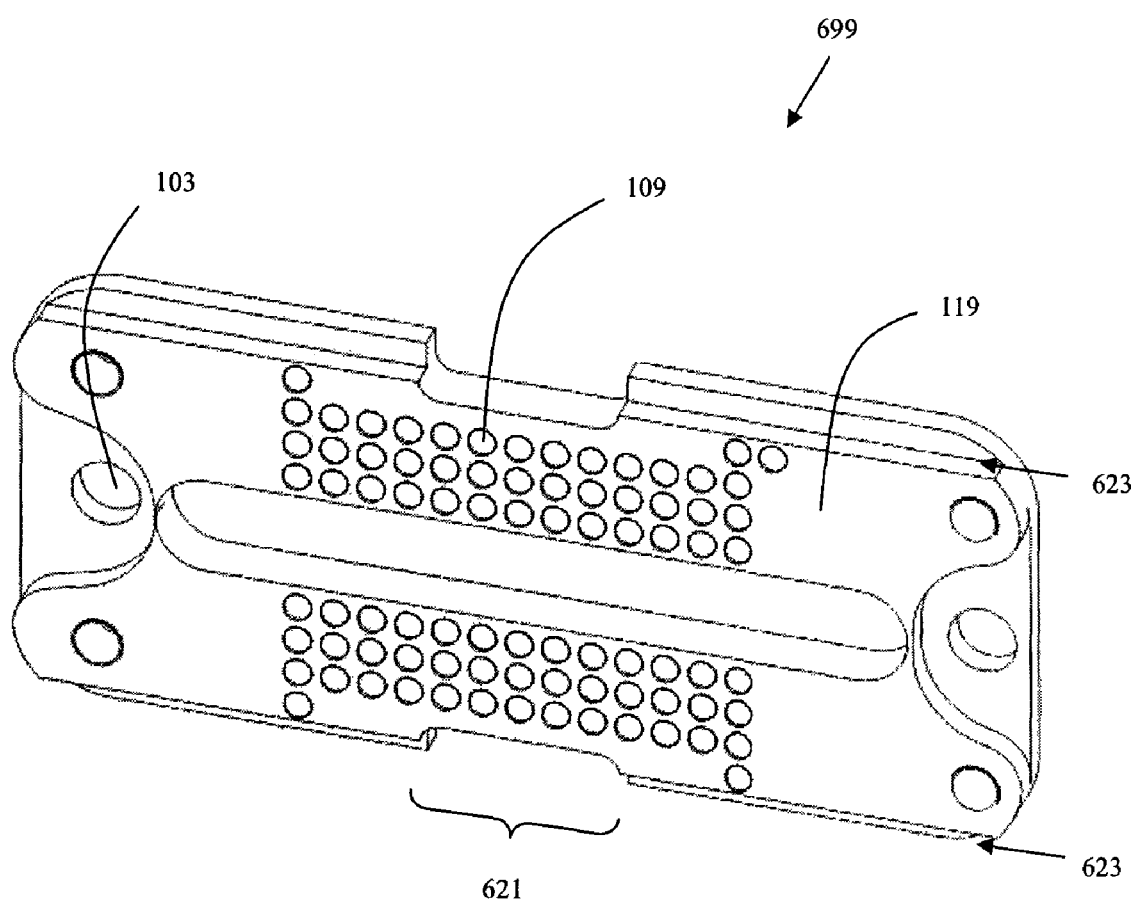
FIG. 3 is a bottom view of FIG. 2.

FIG. 3 is a bottom view of FIG. 2.

There is metal ball grid array on the bottom side 119 of the IC adapter 699. Each metal ball 109 of the metal ball array under the IC adapter 699 is configured on bottom of a corresponding through hole 106, and electrically coupling to each spring 108 in the through hole 106.

Figure 4:
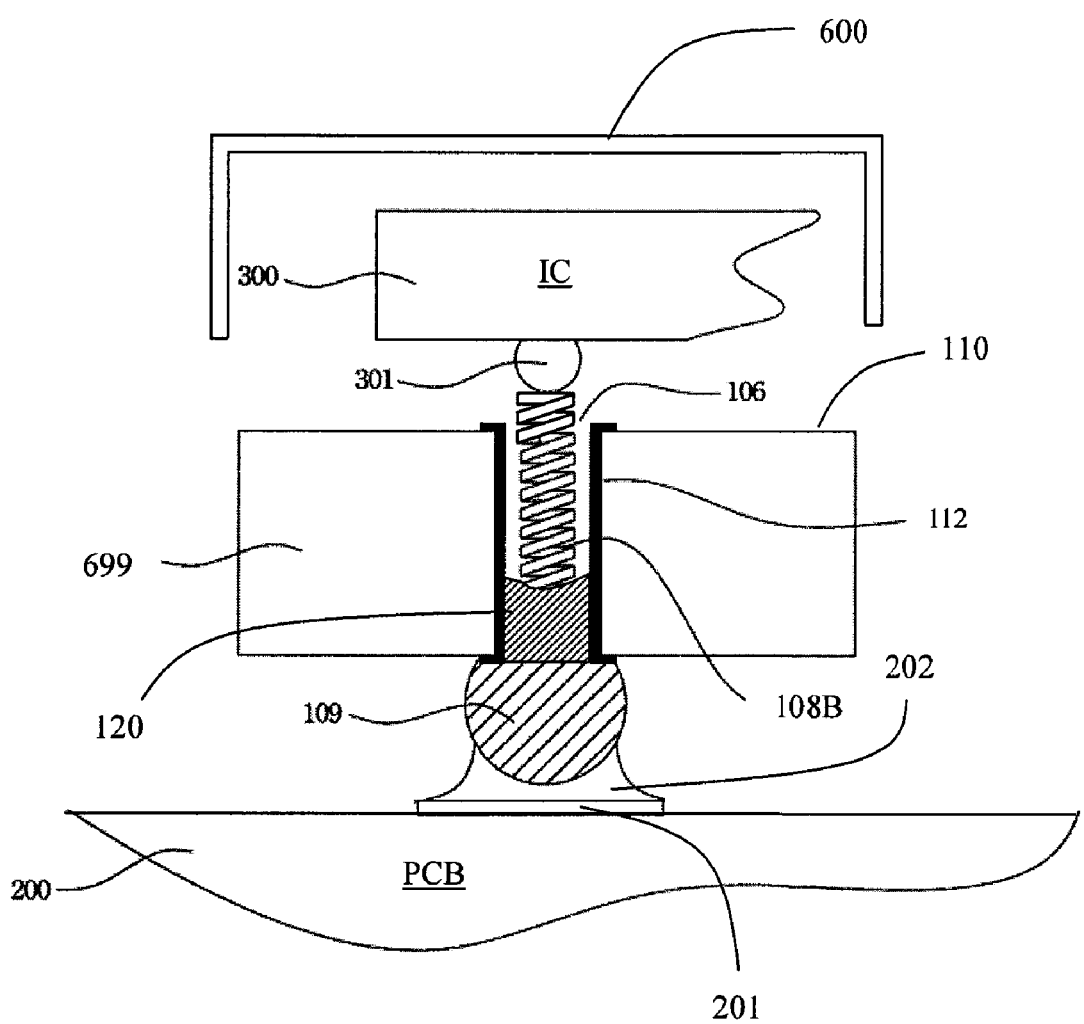
FIG. 4 is a principle for the IC adapter sandwiched in between an IC and a printed circuit board according to the present invention.

FIG. 4 is a principle for the IC adapter sandwiched in between an IC and a printed circuit board according to the present invention. Several elements in FIG. 4 are shown in cross-section with hatching, whereas hatching is omitted from the other elements for simplicity.

The spring 108B has a top end protruded above the top surface 110 of the IC adapter 699. A ball grid array IC 300 is configured on top of the IC adapter 699. The ball grid array IC 300 has a plurality of metal balls 301 on the bottom; only one metal ball 301 is shown for explanation. The IC adapter 699 has a plurality of metal balls 109 on the bottom. The IC adapter 699 is mounted on a printed circuit board (PCB) 200 through metal ball 109 by solder 202. A cap binder 600 is adaptive to press the IC 300 against the IC adapter 699. A spring 108B is in each through hole 106, the top of the spring 108B protrudes above the top surface 110 of the IC adapter 699. A solder slug 120 is configured on the bottom of each through hole 106. The solder slug 120 wraps and clutches the bottom end of the spring 108B firmly. A wall metal 112 is configured over the inside surface of the through hole 106. A metal ball 109 is mounted on the bottom side of the through hole 106 of the IC adapter 699 and electrically coupling to the slug 120.

Figure 5:
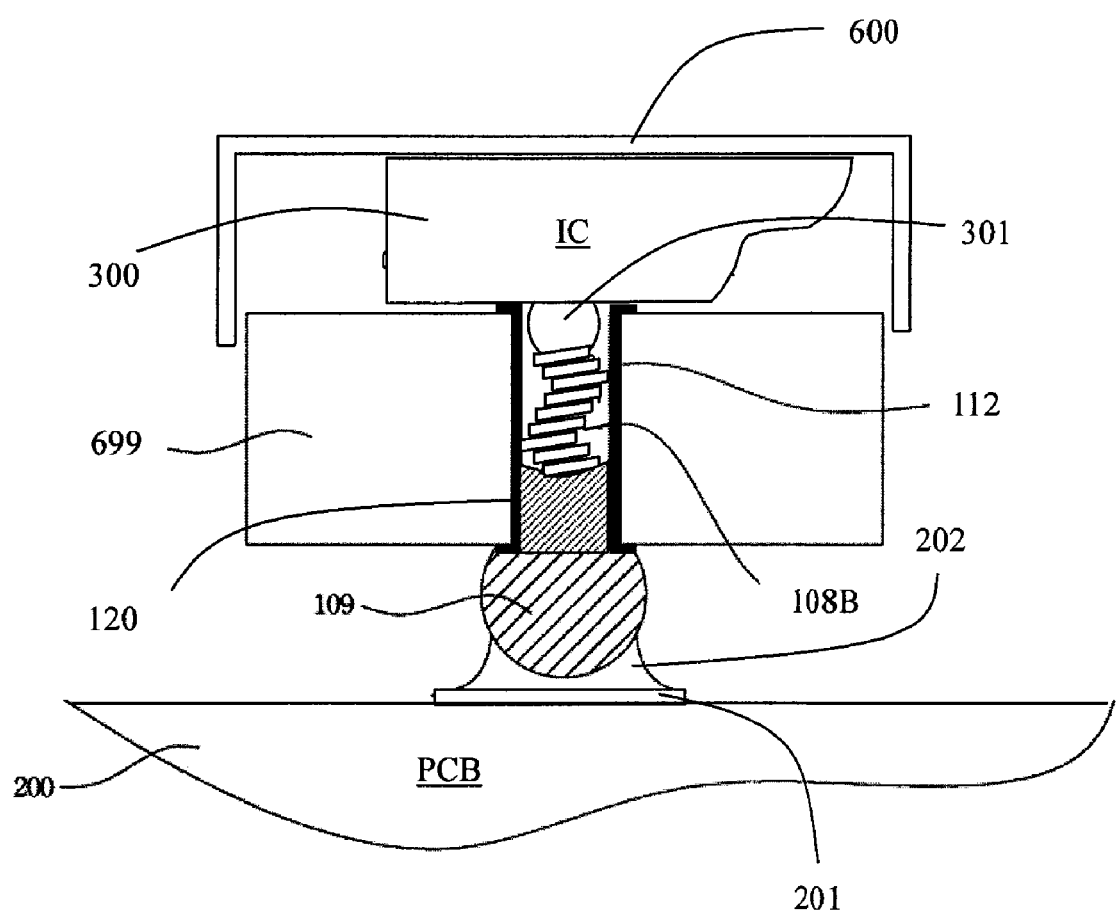
FIG. 5 is a combination view of the elements shown in FIG. 4.

FIG. 5 is a combination view of the elements shown in FIG. 4. Several elements in FIG. 5 are shown in cross-section with hatching, whereas hatching is omitted from the other elements for simplicity.

When the cap binder 600 presses downward the IC 300, the spring 108B is deformed or bent by the metal ball 301 of the IC 300 to touch the wall metal 112 within the through hole 106, this contact arrangement shorts the path for electrical signal's transmission from the ball grid array IC 300 to the metal pad 201 through the metal ball 301, spring 108B, wall metal 112, the metal ball 109, and solder 202.

FIGS. 6A~6H is a first embodiment with a sliding cap binder according to the present invention. In cross-section views of FIGS. 6D, 6F, 6H hatching is omitted for simplicity.

Figure 6A:
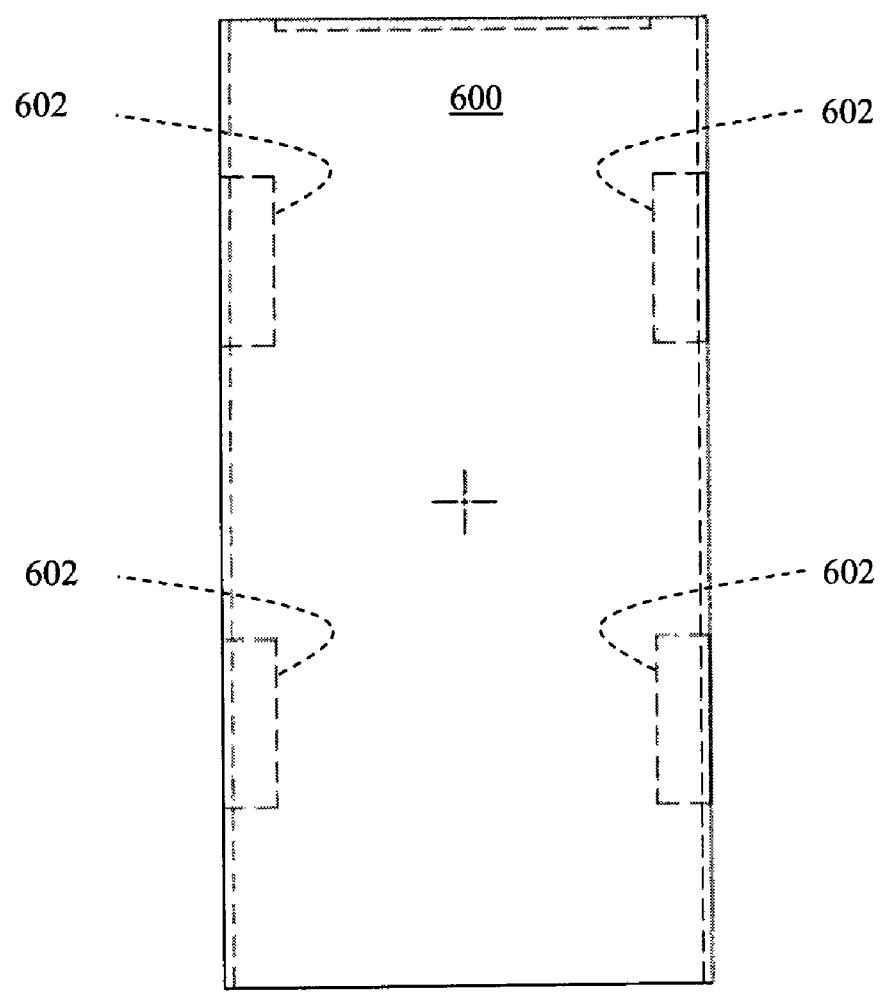
FIG. 6A~6H is a first embodiment with a sliding cap binder according to the present invention.
Figure 6B:
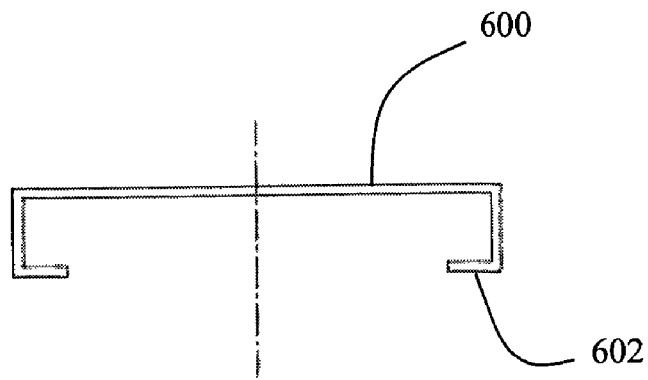
Figure 6C:
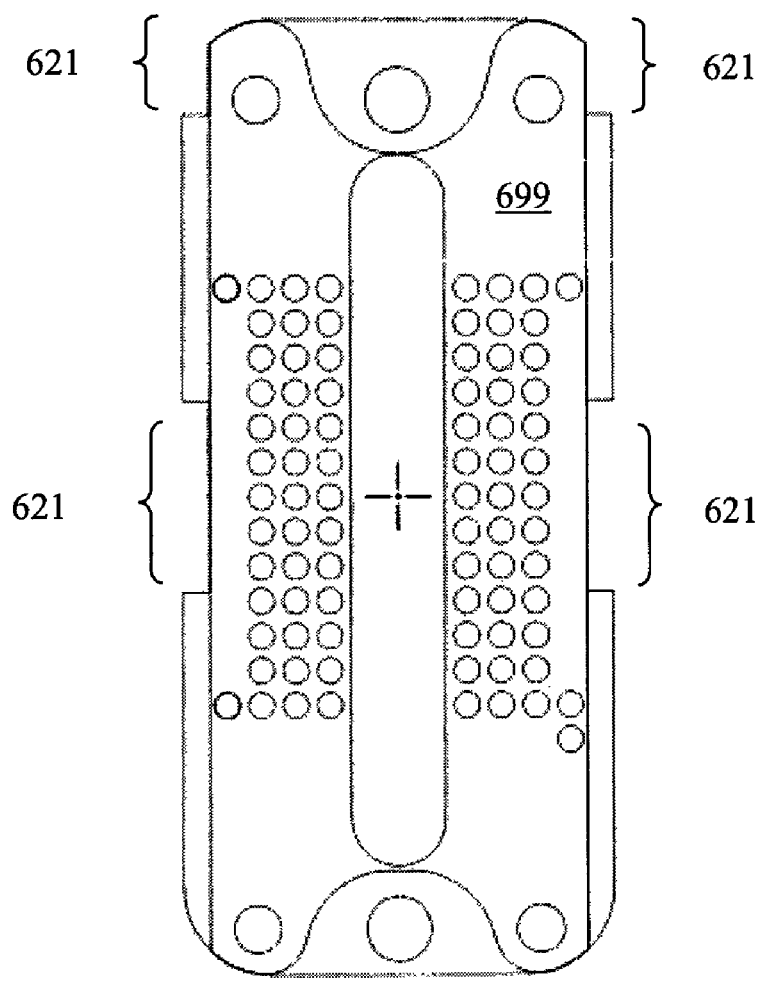
Figure 6D:
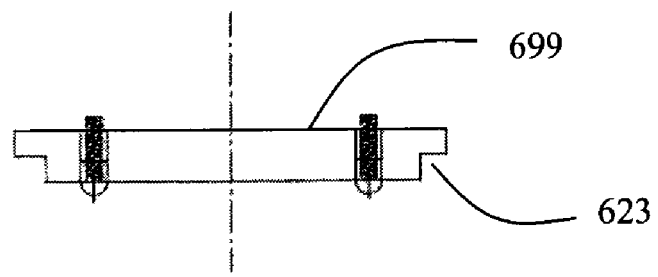

FIG. 6A is a top perspective view of a sliding cap 600 as the cap binder. The sliding cap 600 is designed to be in a rectangular shape which has four protrusions 602 on the bottom, two protrusions 602 are on the left bottom side and the other two protrusions 602 are on the right bottom side. FIG. 6B, a side view of FIG. 6A, shows the protrusions 602 on the bottom of the sliding cap 600. FIG. 6C is a top view of an IC adapter 699 which has four recesses 621, two recessed 621 are on the left side of the IC adapter 699 and the other two recesses 621 are on the right side of the IC adapter 699. FIG. 6D, a side view of FIG. 6C, shows a pair of sliding recess 623 is made underside, one sliding recess 623 is on the bottom left side, and the other one sliding recess 623 is on the bottom right side. The left side sliding recess 623 communicates with the left side position recess 621, and the right side sliding recess 623 communicates with the right side position recess 621. The position recesses 623 are designed for insertion of the protrusions 602 and then slide along the sliding recess 623 to lock the sliding cap 600 in position and meanwhile to lock the ball grid array IC 300 in between.

Figure 6E:
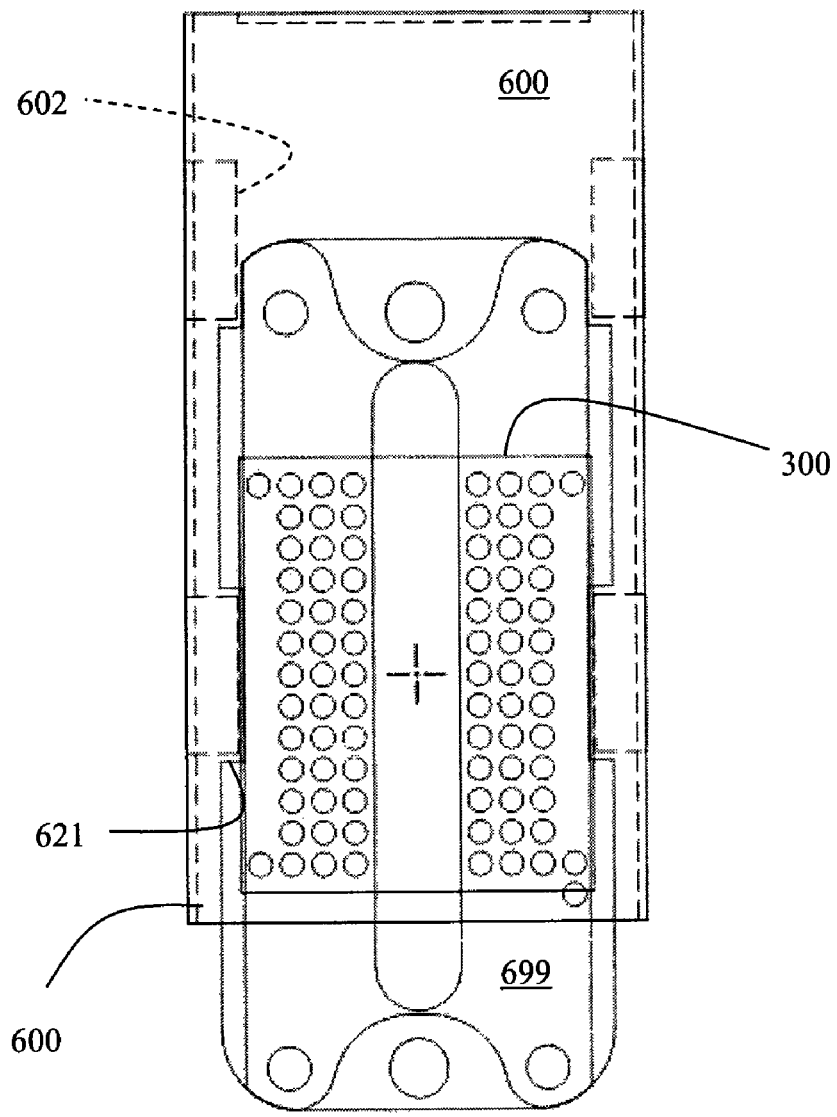

FIG. 6E shows a top perspective view for a combination of the sliding cap 600 mechanically coupling to the IC adapter 699.

Figure 6F:
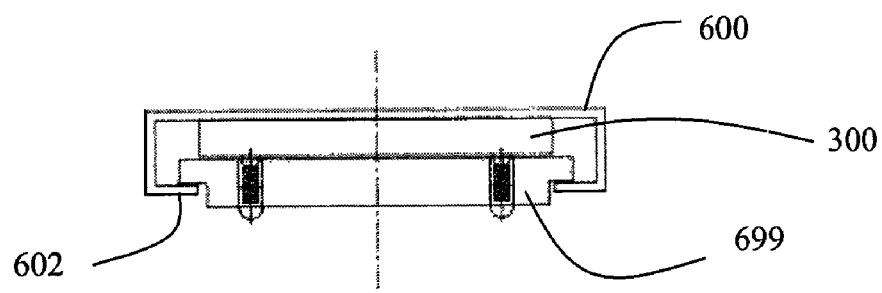
Figure 6G:
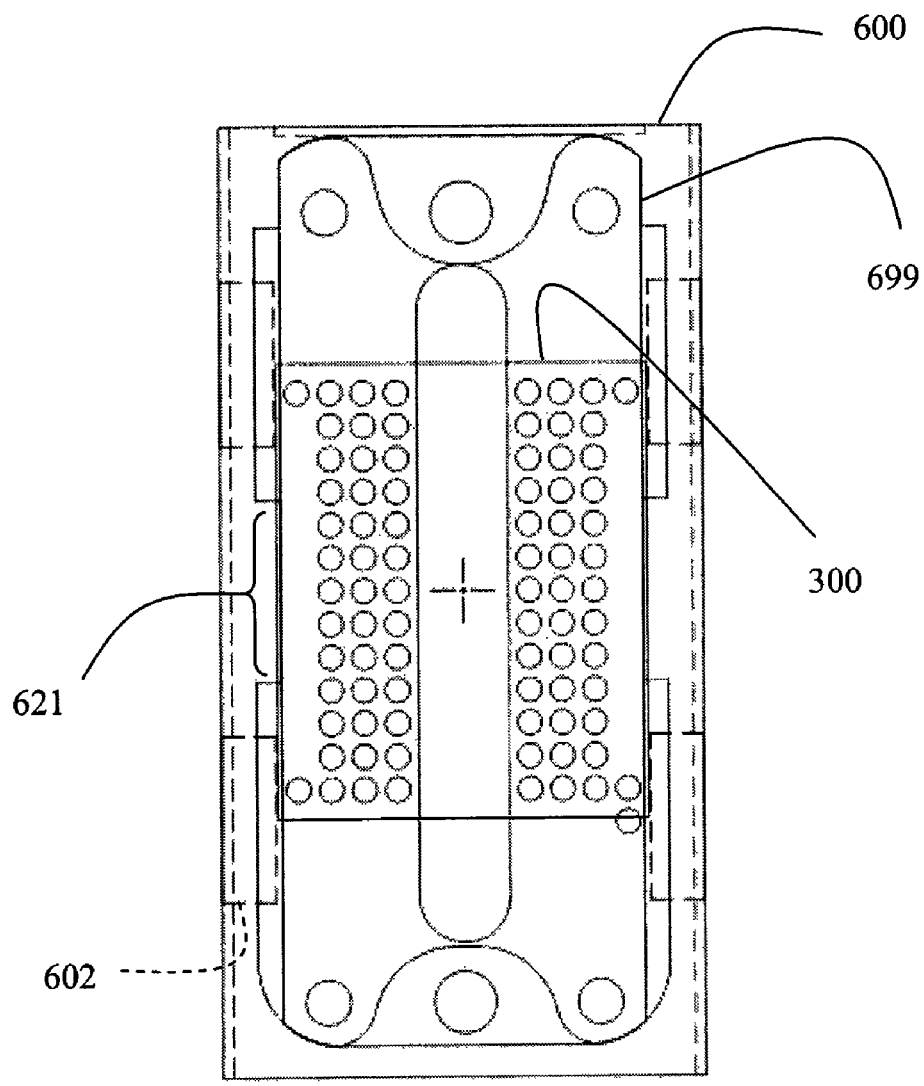
Figure 6H:
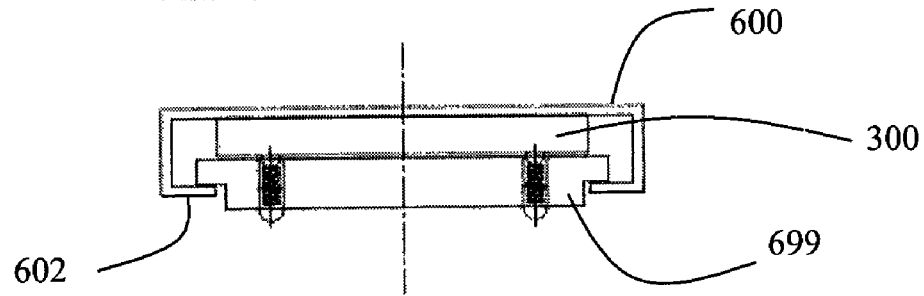

Each of the four protrusions 602 of the sliding cap 600 is adaptive to insert into one of the four recesses 621 of the IC adapter 699. When the sliding cap 600 presses downward against the ball grid array IC 300, the ball grid array IC 300, sandwiched in between the sliding cap 600 and the IC adapter 699, is pressed down in position. FIG. 6F, a side view of FIG. 6E, shows the sandwiched IC 300 is pressed against the IC adapter 699 in position by a pressure from the sliding cap 600 on top. The metal ball 301 of the IC 300 contacts with the spring 108B of the IC adapter 699. FIG. 6G is a top perspective view to show the sliding cap 600 is inserted and sliding to a position for pressing and locking the IC 300 onto the IC adapter 699. FIG. 6H, a side view of FIG. 6G shows the IC 300 is sandwiched in position with the sliding cap 600 on top and the IC adapter 699 on bottom. The metal ball 301 of the IC 300 contacts with the spring 108B of the IC adapter 699.

Figure 7:
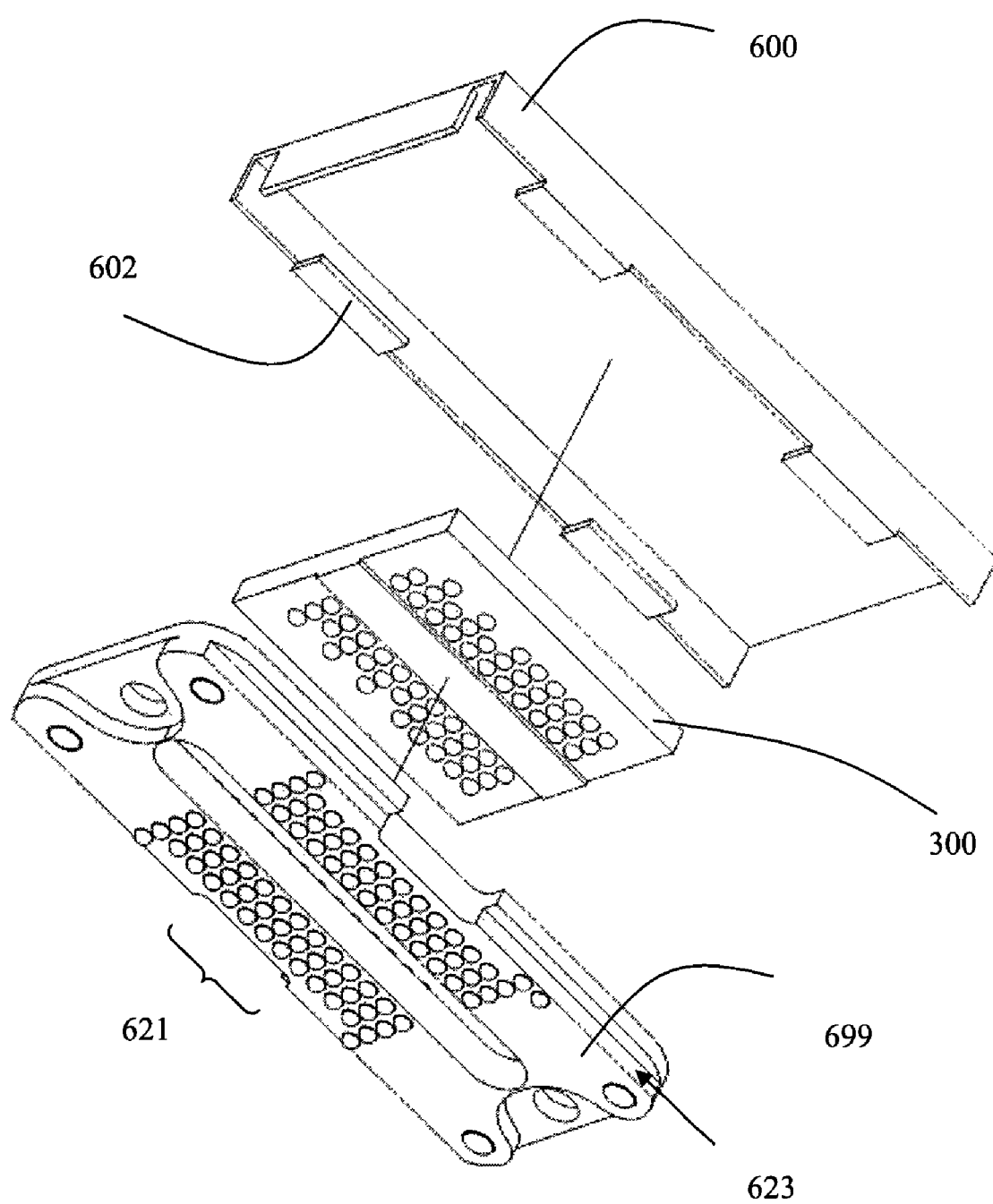
FIG. 7 is an explosion bottom view of FIG. 6G according to the present invention.

FIG. 7 is an explosion bottom view of FIG. 6G according to the present invention.

The protrusions 602 are configured on the bottom of the sliding cap 600, corresponding position recesses 621 are configured on two sides of the IC adapter 699, and a pair of sliding recesses 623 are made underside of the IC adapter 699. Each of the protrusions 602 is adaptive to insert into one of the corresponding position recesses 621, and then slide to lock the IC 300 in position along the sliding recesses 623.

Figure 8:
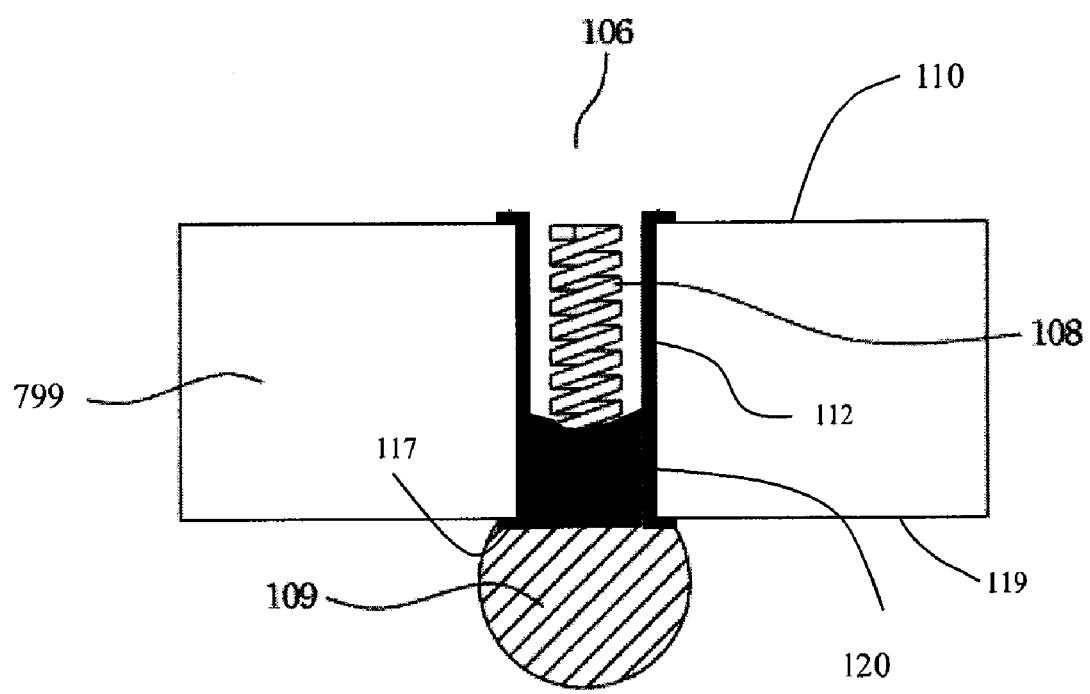
FIG. 8 shows a second embodiment of the IC adapter according to the present invention.

FIG. 8 shows a second embodiment of the IC adapter according to the present invention. Several elements in FIG. 8 are shown in cross-section with hatching, whereas hatching is omitted from the other elements for simplicity. A metal ring pad 117 is provided on the bottom surface 119 of the IC adapter 799. The metal ring pad 117 surrounds and is electrically coupled to the wall metal 112.

The principle is the same as what has been described above, however the spring 108 in the second embodiment is different from the spring 108B in the first embodiment in that, in the second embodiment, the spring 108 in each through hole 106 does not protrude above the top surface 110 of the IC adapter 799.

Figure 9:
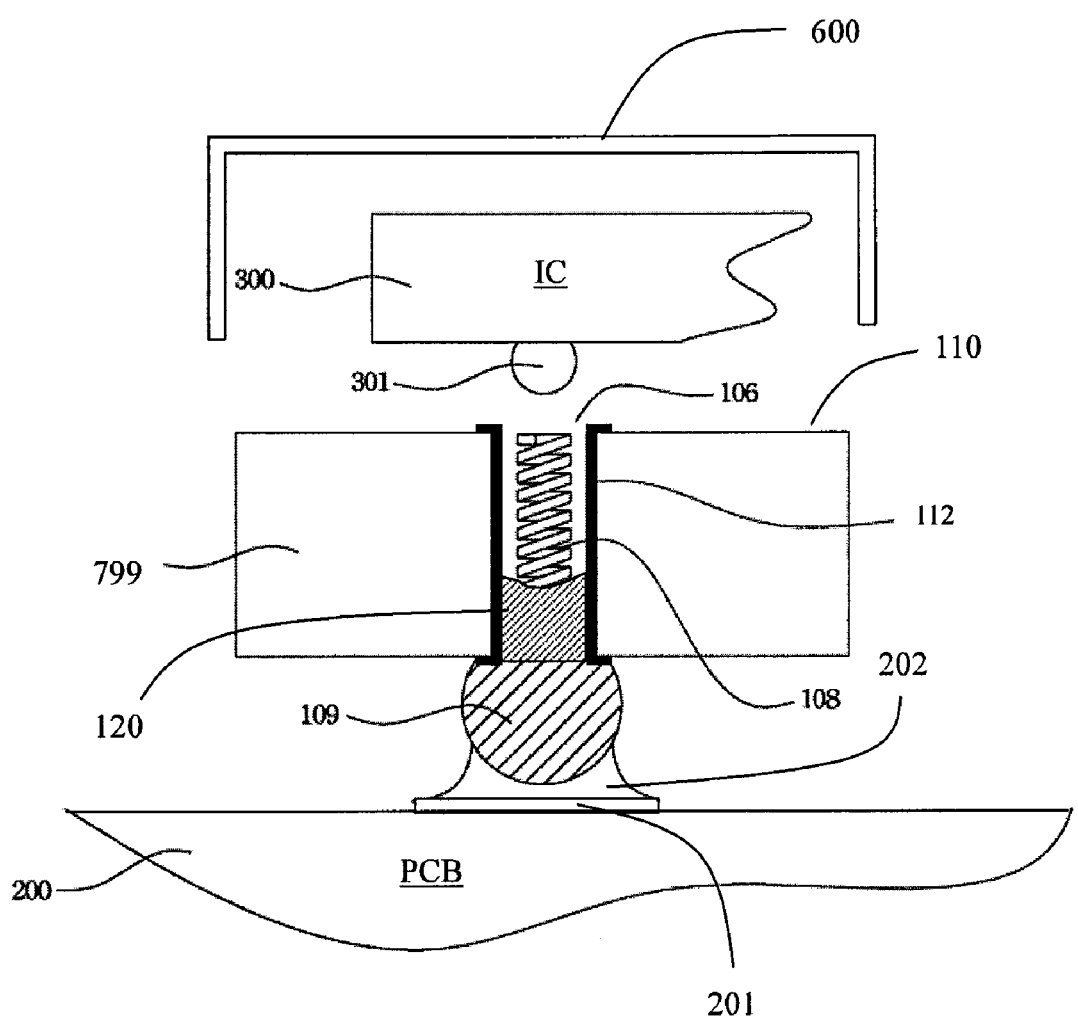
FIG. 9 is an explosion view of a combination system according to the present invention.

FIG. 9 is an explosion view of a combination system according to the present invention. Several elements in FIG. 9 are shown in cross-section with hatching, whereas hatching is omitted from the other elements for simplicity.

The ball grid array IC adapter 799 is mounted on top of a printed circuit board (PCB) 200. A metal pad 201 is configured on top surface of the printed circuit board 200. Solder 202 binds the metal ball 109 of the IC adapter 799 onto the metal pad 201 of the printed circuit board 200. A ball grid array IC 300 has a ball grid array 301 underside. In the figure, only one metal ball 301 of the ball grid array IC 300 is shown for explanation. The metal ball 301 has a diameter smaller than a diameter of the through hole 106 of the IC adapter 799 as an example. However the diameter of the ball 301 can be either equal or a little larger than the diameter of the through hole 106 such that the ball 301 is adaptive to press against the spring 108 in the through hole 106 when the ball grid array IC 300 is pressed against the IC adapter 799. A detachable binding element such as a cap 600 is configured on top of the ball grid array IC 300 to provide a pressure downward to the ball grid array IC 300 against the IC adapter 799.

Figure 10:
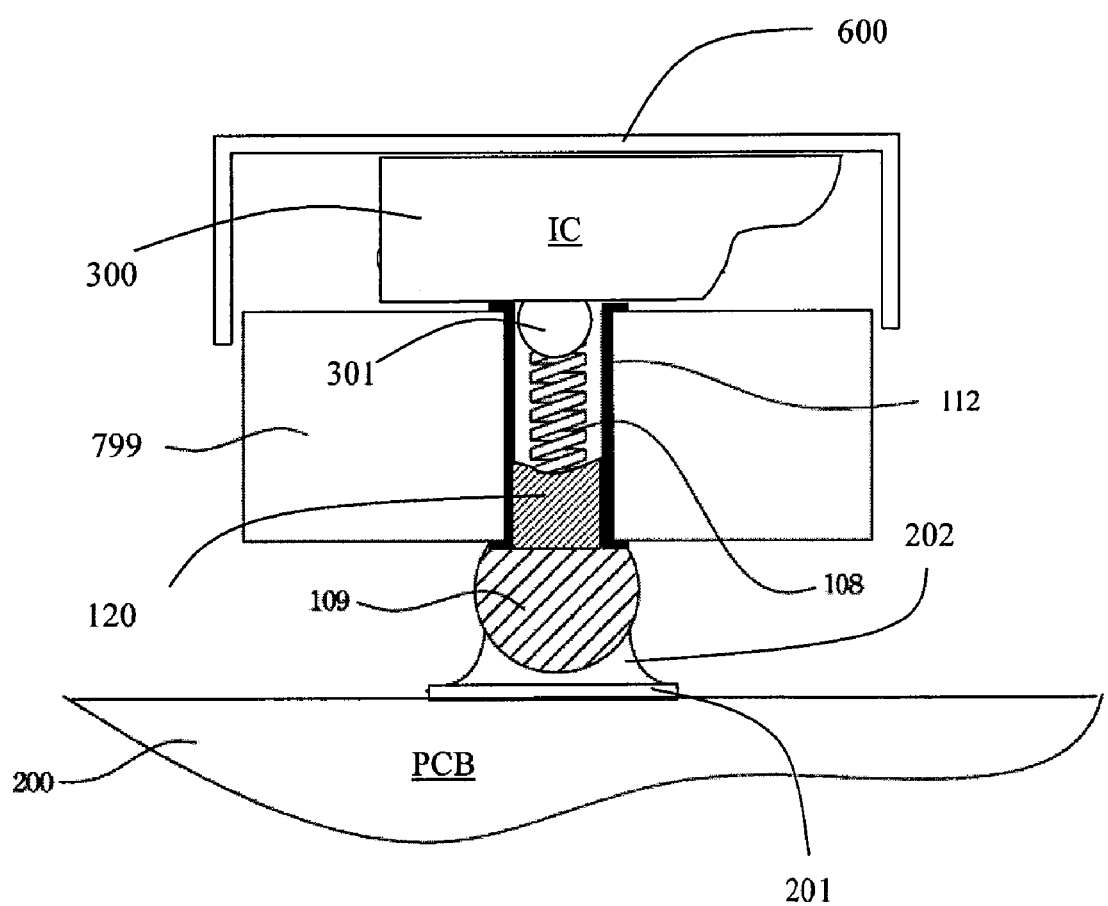
FIG. 10 is a combination view of the elements shown in FIG. 9.

FIG. 10 is a combination view of the elements shown in FIG. 9. Several elements in FIG. 10 are shown in cross-section with hatching, whereas hatching is omitted from the other elements for simplicity.

When the cap binder 600 presses the IC 300 against the IC adapter 799 in position, the metal ball 301 electrically contacts with the spring 108 in the through hole 106 such that the ball grid array IC 300 can be electrically coupling to the metal pad 201 of the printed circuit board 200 through the metal ball 301, the spring 108, metal slug 120, metal ball 109, and solder 202.

Figure 11:
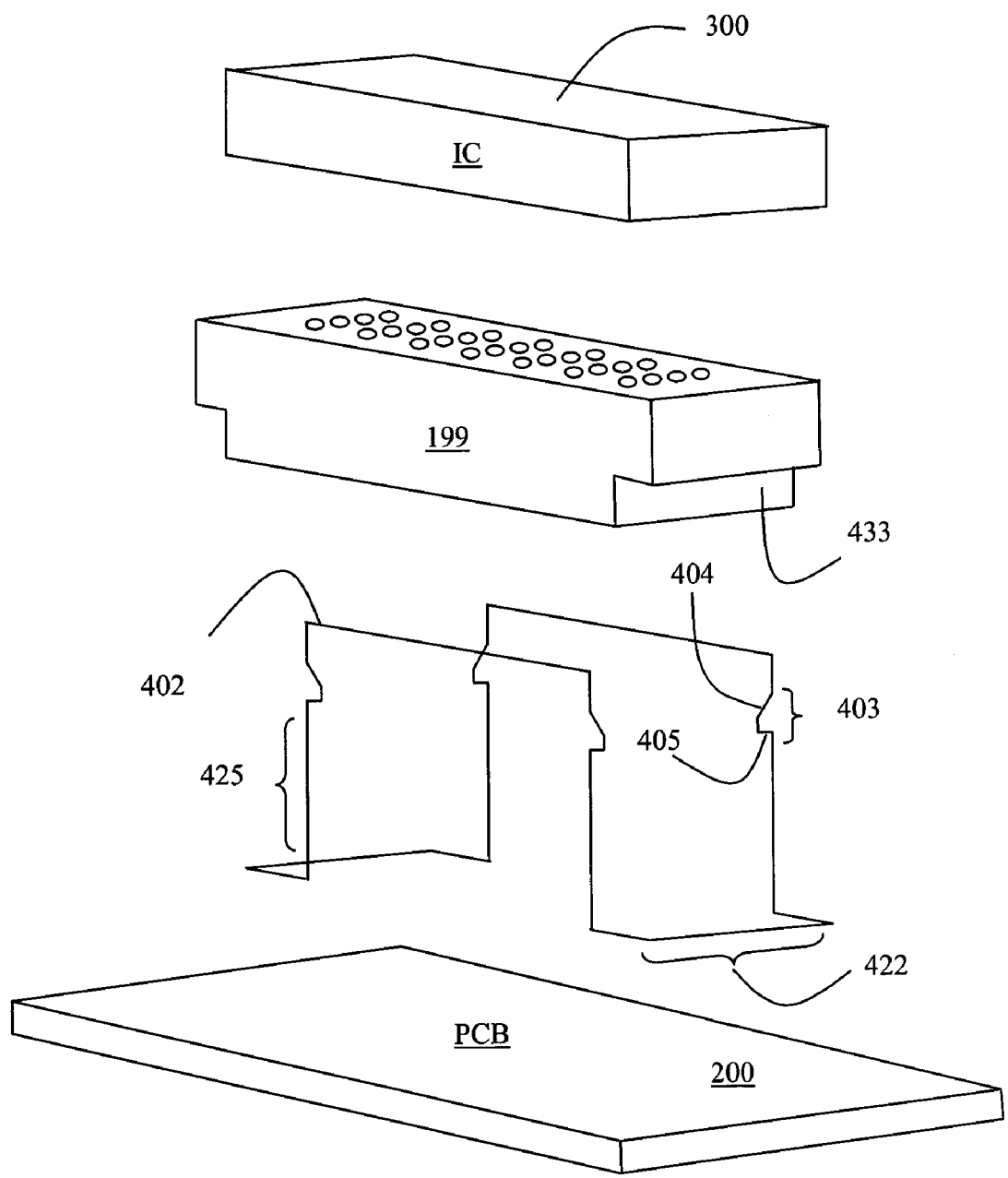
FIG. 11 is an explosion view of a second combination embodiment with a flexible frame binder according to the present invention.

FIG. 11 is an explosion view of a second combination embodiment with a flexible frame binder according to the present invention.

A flexible frame 402 is used as a binding element. The flexible frame 402 has a pair of flat U-shape bottom frames 422. The IC adapter 199 has a pair of recesses 433 underside. The U-shape bottom frames 422 are adaptive to mount to the recess 433 for fixing the flexible frame 402 onto the IC adapter 199. The flexible frame 402 has two pairs of upward extended frame 425. Each of the upward extended frames 425 has a curved portion 403 with a skew portion 404 and a bottom flat portion 405.

Figure 12:
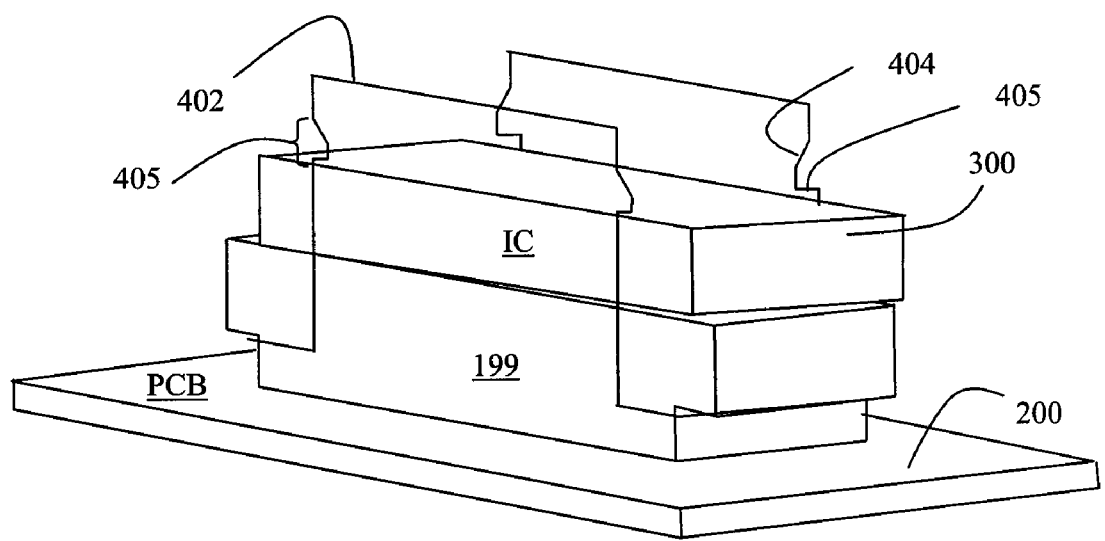
FIG. 12 shows a combination of the elements shown in FIG. 11.

FIG. 12 shows a combination of the elements shown in FIG. 11.

The skew portion 404 of the curved portion 403 facilitates sliding down of the ball grid array IC 300, the flat bottom portion 405 of the curved portion 403 is used for securing the ball grid array IC 300 on a top corner of the ball grid array IC 300.

Figure 13:
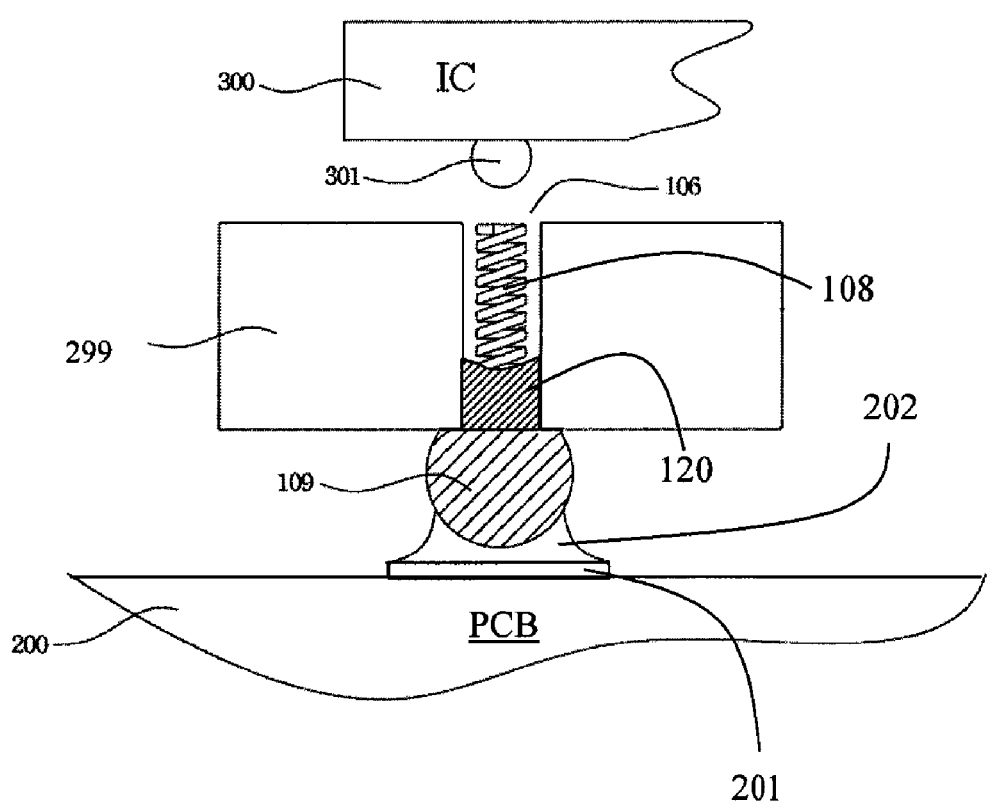
FIG. 13 is a third embodiment of the IC adapter according to the present invention.

FIG. 13 is a third embodiment of the IC adapter according to the present invention. Several elements in FIG. 13 are shown in cross-section with hatching, whereas hatching is omitted from the other elements for simplicity.

The principle is the same as above, however there is no wall metal plated on the wall surface of the through hole 106. The bottom end of the spring 108 is wrapped and clutched firmly by a metal slug 120 in the through hole 106. A metal ball 109 is attached onto the bottom of the metal slug 120.

Figure 14:
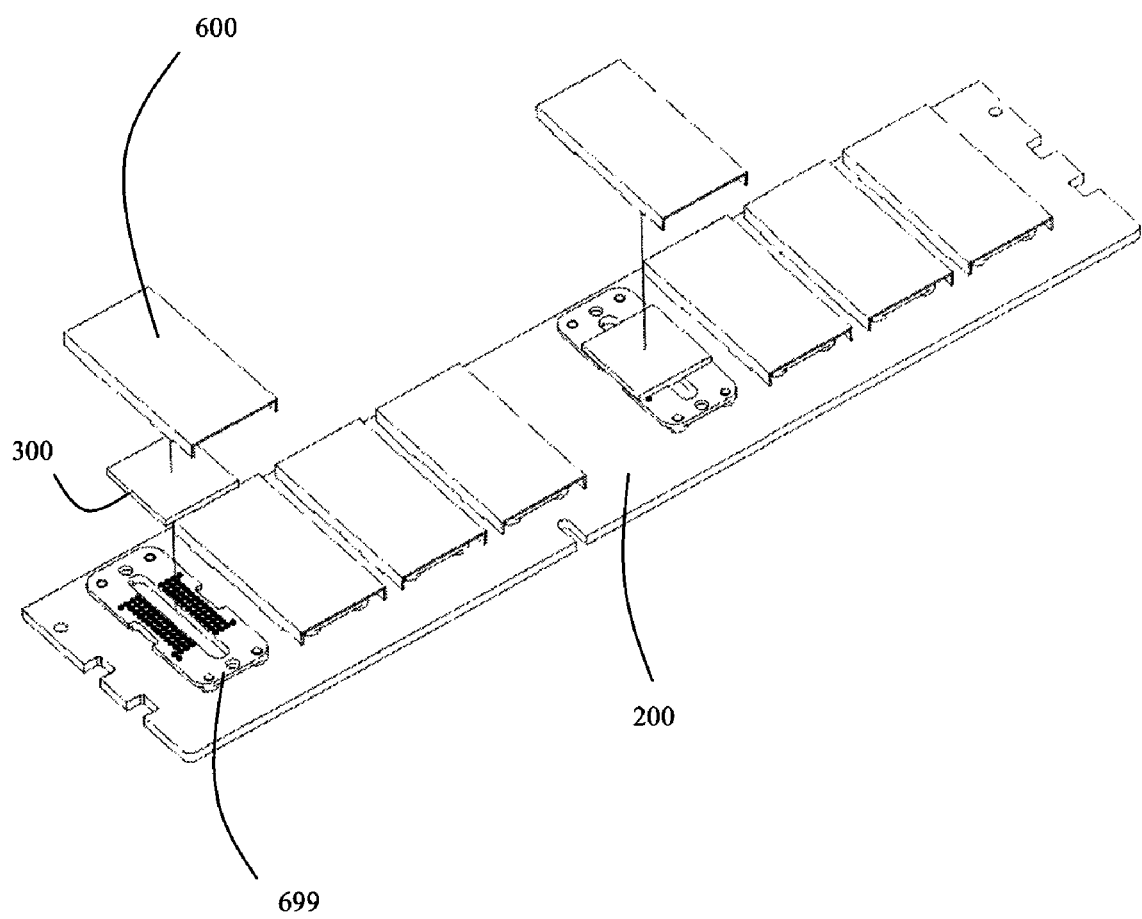
FIG. 14 is multiple IC adapter sets mounted on a common substrate according to the presentation invention.

FIG. 14 is multiple IC adapter sets mounted on a common substrate according to the presentation invention.

A plurality of IC adapter 699 is mounted on a same printed circuit board 200. A plurality of sliding cap 600, each mechanically couples with one of the IC adapter 699. The sliding cap 600 can be slid away for detach or mount an IC 300 with using any maintenance tool at any time.

While several embodiments have been described by way of example, it will be apparent to those skilled in the art that various modifications may be made without departing from the spirit of the present invention. Such modifications are all within the scope of the present invention, as defined by the appended claims. The shaft door is a projection screen.

What is claimed is:

1. An integrated circuit (IC) adapter for interconnecting and removably mounting a ball grid array IC to a printed circuit board, said IC adapter comprising:
   a substrate, having a plurality of through holes;
   a wall metal on an inner wall of each said through hole;
   a resilient element, in each said through hole;
   a metal slug, clutching a bottom end of said resilient element on a bottom of said through hole; and
   a metal ball, attached on a bottom surface of said substrate and being electrically coupled to said metal slug;
   wherein the resilient element has
   a non-compressed state in which the resilient element projects from within the through hole upwardly beyond an upper opening of said through hole on a top surface of the substrate, and
   a compressed state in which the resilient element is pressed down by the IC and radially deformed to directly physically and electrically contact the wall metal of the through hole.

2. The IC adapter as claimed in claim 1, wherein said metal ball under said substrate has a diameter larger than a diameter of said through hole.

3. The IC adapter as claimed in claim 1, wherein said resilient element in the non-compressed state is free of direct contact with the wall metal.

4. An IC mounting system, comprising:
   the IC adapter as claimed in claim 1;
   the printed circuit board, having a plurality of metal pads on a top surface thereof; and
   a plurality of solders, each electrically coupling one of said metal pads with a corresponding one of said metal balls under said substrate.

5. The IC mounting system as claimed in claim 4, further comprising:
   the ball grid array IC, having a plurality of metal balls on an underside thereof;
   a binding element, pressing said IC against said IC adapter; and
   each of said metal balls under said IC being electrically coupled with and physically pressing down a top end of said resilient element in a corresponding one of said through holes to cause said resilient element to radially deform and directly physically and electrically contact the wall metal of the through hole.

6. The IC mounting system as claimed in claim 5, wherein said IC adapter has
   a pair of left side position recesses on the left side, a pair of right side position recesses on the right side; and
   a pair of sliding recesses, one being on the left underside and the other one being on the right underside;
   said binding element is a sliding cap, comprising:
      a pair of protrusions on the left bottom side, and adaptive to be inserted into said pair of left side position recesses of said IC adapter, and to slide along one of said sliding recesses; and
      a pair of protrusions on the right bottom side, and adaptive to be inserted into said pair of right side position recesses of said IC adapter, and to slide along the other one of said sliding recesses.

7. The IC mounting system as claimed in claim 5, wherein said resilient element is a spring.

8. An integrated circuit (IC) adapter for interconnecting and removably mounting a ball grid array IC to a printed circuit board, said IC adapter comprising:
   a substrate, having a plurality of through holes;
   a resilient element, in each said through hole;
   a metal slug, clutching a bottom end of said resilient element on a bottom of said through hole;
   a metal ball, attached on a bottom surface of said substrate and being electrically coupled to said metal slug;
   a wall metal, configured over an inside surface of each said through hole; and
   a metal ring pad, on the bottom surface of said substrate and surrounding said wall metal and being electrically coupled to said wall metal.

9. An IC mounting system, comprising:
   the IC adapter as claimed in claim 8;
   the printed circuit board, having a plurality of metal pads on a top surface thereof; and
   a plurality of solders, each electrically coupling one of said metal pads with a corresponding one of said metal balls under said substrate.

10. The IC mounting system as claimed in claim 9, further comprising:
    the ball grid array IC, having a plurality of metal balls on an underside thereof;
    a binding element, pressing said IC against said IC adapter; and
    each of said metal balls under said IC being electrically coupled with and physically pressing down a top end of said resilient element in a corresponding one of said through holes.

11. The IC mounting system as claimed in claim 10, wherein said binding element is a flexible frame which has:
    upward protrusions facing each other, each of said upward protrusions having
       an inclined top portion for facilitating said IC sliding down between said upward protrusions, and
       a flat bottom portion for securing said ball grid array IC from above after said IC has slid pass the inclined top portion; and
    an U-shape bottom frame, mechanically coupling with a pair of recesses under said IC adapter.

12. The IC mounting system as claimed in claim 10, wherein said binding element is a sliding cap which has:
    a pair of L-shaped bottom portions engaged with a pair of corresponding recesses under said IC adapter such that said sliding cap is adaptive to slide back and forth either for mounting said IC on said IC adapter or detaching said IC off said IC adapter.

13. The IC mounting system as claimed in claim 9, wherein said resilient element is a spring.

14. The IC mounting system as claimed in claim 13, wherein said spring has
    a non-compressed state in which the spring projects from within the through hole upwardly beyond an upper opening of said through hole on a top surface of the substrate, and
    a compressed state in which the spring is pressed down by the IC and radially deformed to directly physically and electrically contact with said wall metal.

15. The IC mounting system as claimed in claim 13, wherein said spring has a non-compressed state in which the spring is completely received within the through hole without projecting upwardly beyond an upper opening of said through hole on a top surface of the substrate.

16. The IC adapter as claimed in claim 8, wherein said spring has a non-compressed state in which the spring is completely received within the through hole without projecting upwardly beyond an upper opening of said through hole on a top surface of the substrate.

17. An integrated circuit (IC) mounting system, comprising:
   a printed circuit board having a plurality of metal pads on a top surface thereof;
   a ball grid array IC having a plurality of metal balls on an underside thereof;
   an IC adapter for interconnecting and removably mounting the ball grid array IC to the printed circuit board, said IC adapter comprising:
      a substrate having a plurality of through holes;
      a resilient element in each said through hole;
      a metal slug clutching a bottom end of said resilient element on a bottom of said through hole; and
      a metal ball attached on a bottom surface of said substrate and being electrically coupled to said metal slug;
   a plurality of solders each electrically coupling one of said metal pads with a corresponding one of said metal balls under said substrate; and
   a binding element pressing said IC against said IC adapter, wherein each of said metal balls under said IC is electrically coupled with and physically presses down a top end of the resilient element in a corresponding one of said through holes;
   wherein said binding element is a flexible frame which has:
   upward protrusions facing each other, each of said upward protrusions having
      an inclined top portion for facilitating said IC sliding down between said upward protrusions, and
      a flat bottom portion for securing said ball grid array IC from above after said IC has slid pass the inclined top portion; and
   a U-shape bottom frame, mechanically coupling with a pair of recesses under said IC adapter.

* * * * *